United States Patent [19]
Kondo

[11] Patent Number: 6,103,138
[45] Date of Patent: Aug. 15, 2000

[54] SILICON-SYSTEM THIN FILM, PHOTOVOLTAIC DEVICE, METHOD FOR FORMING SILICON-SYSTEM THIN FILM, AND METHOD FOR PRODUCING PHOTOVOLTAIC DEVICE

[75] Inventor: Takaharu Kondo, Kyotanabe, Japan

[73] Assignee: Canon Kabushiki Kaisha, Tokyo, Japan

[21] Appl. No.: 09/232,699

[22] Filed: Jan. 19, 1999

[30] Foreign Application Priority Data

Jan. 21, 1998 [JP] Japan .................................. 10-009417

[51] Int. Cl.[7] ............................ H02N 6/00; H01L 27/142
[52] U.S. Cl. ............................... 252/62.3 E; 252/62.3 R; 438/488; 438/28; 136/249; 257/65
[58] Field of Search ......................... 252/63.3 E, 62.3 R; 438/488, 28; 136/249; 257/64, 65

[56] References Cited

U.S. PATENT DOCUMENTS

| | | | |
|---|---|---|---|
| 4,625,224 | 11/1986 | Nakagawa et al. | 357/23.7 |
| 4,719,501 | 1/1988 | Nakagawa et al. | 357/59 |
| 4,766,477 | 8/1988 | Nakagawa et al. | 357/59 |
| 4,905,072 | 2/1990 | Komatsu et al. | 357/59 |
| 4,982,251 | 1/1991 | Nakagawa et al. | 357/23.7 |
| 5,804,466 | 9/1998 | Arao et al. | 438/95 |

*Primary Examiner*—C. Melissa Koslow
*Attorney, Agent, or Firm*—Fitzpatrick, Cella, Harper & Scinto

[57] ABSTRACT

This invention provides a silicon-system thin film, characterized by containing at least 1 ppm of phosphorus atoms and diffraction intensity at the (220) plane with X ray or electron beams of at least 30% of total diffraction intensity, photovoltaic device that contains the silicon-system thin film, and methods for forming the silicon-system thin film and photovoltaic device. These methods give the silicon-system thin film and photovoltaic device of high photoelectric conversion efficiency at a high film-making rate.

32 Claims, 3 Drawing Sheets

SILICON-SYSTEM THIN FILM, PHOTOVOLTAIC DEVICE, METHOD FOR FORMING SILICON-SYSTEM THIN FILM, AND METHOD FOR PRODUCING PHOTOVOLTAIC DEVICE

BACKGROUND OF THE INVENTION

1. Field of the Invention

This invention relates to a silicon-system thin film, photovoltaic device using the same, method for forming the silicon-system thin film, and method for producing the photovoltaic device. The photovoltaic device of the present invention is applicable to various purposes, e.g., solar cells, sensors and imaging cells.

2. Related Background Art

Silicon-system thin films showing crystallinity have been formed by the cast method or the like which grows the film from the liquid phase. However, these methods need treatment of the films at high temperature, which tends to decrease productivity and increase cost.

In an attempt to solve these problems, Meier et al. propose a new method for producing solar cells at lower temperature, in which a microcrystalline solar cell of p-i-n structure is formed on a substrate kept at 220° C. by glow discharge at a high frequency of 110 MHz ("ON THE WAY TOWARDS HIGH EFFICIENCY THIN FILM SILICON SOLAR CELLS BY THE "MICROMORPH" CONCEPT," J. Meier et al., Mat. Res. Soc. Symp. Proc., Vol. 420, p3, 1996). It is reported that the cell shows a photoelectric conversion efficiency of 7.7%. It is also reported that a stacked solar cell of amorphous and microcrystalline silicone films shows an efficiency of 13.1%.

The above method using glow discharge, although giving a microcrystalline silicon film of high photoelectric conversion efficiency, needs uneconomically much time to secure a necessary film thickness, because of insufficient film-making rate.

It is known that carrier mobility in a photovoltaic device that uses a silicon-system thin film showing crystallinity generally tends to be deteriorated by various causes, including silicon dangling bonds in the grain boundaries, strains evolving in the vicinity of the grain boundaries and imperfectness of the crystal itself, with the result that photoelectric conversion efficiency of the cell may not be sufficiently high.

One of the measures to reduce the above adverse effects is to increase crystallinity of the cell, which, however, involves decreased film-making rate, and additional steps, such as heat treatment of the substrate with electron beams, laser beams or heat from a lamp, or cycles of forming a silicon-system thin film and annealing in a hydrogen atmosphere. These should increase film-making time and production cost.

It is an object of the present invention to provide a silicon-system thin film and photovoltaic device using the same of high photoelectric conversion efficiency, capable of being produced at a commercially practical film-making rate by solving the above problems.

SUMMARY OF THE INVENTION

This invention provides a silicon-system thin film, characterized by containing at least 1 ppm of phosphorus atoms and having a diffraction intensity at (220) plane with X ray or electron beams of at least 30% of total diffraction intensity.

This invention also provides a photovoltaic device having a plurality of silicon-system semiconductor layers, different from each other in conductance type, on a substrate, wherein at least one of the silicon-system semiconductor layers has a silicon-system thin film containing at least 1 ppm of phosphorus atoms and having diffraction intensity at (220) plane with X ray or electron beams of at least 30% of total diffraction intensity.

This invention also provides a method for forming a silicon-system thin film on a substrate by plasma CVD, wherein the silicon-system thin film is controlled to contain at least 1 ppm of phosphorus atoms and to have diffraction intensity at (220) plane with X ray or electron beams of at least 30% of total diffraction intensity.

This invention also provides a method for fabricating a photovoltaic device which comprises forming a plurality of silicon-system semiconductor layers, different from each other in conductance type, on a substrate by plasma CVD, wherein at least one of the silicon-system semiconductor layers is controlled to have a silicon-system thin film containing at least 1 ppm of phosphorus atoms and having diffraction intensity at (220) plane with X ray or electron beams of at least 30% of total diffraction intensity.

It is preferable that the silicon-system thin film contains phosphorus atoms at 100 ppm or less, and is a virtually i-type semiconductor. The phosphorus atoms are preferably distributed unevenly in the silicon-system thin film, higher on the substrate side. The silicon-system thin film is prepared by plasma CVD at a high frequency, preferably in a range from 10 MHz to 10 GHz, more preferably from 30 to 500 MHz. The silicon-system thin film may optionally contain Ge or C. The high frequency is applied using an electrode, preferably at least 3 cm apart from the substrate.

One embodiment of the photovoltaic device of the present invention has at least one pin junction, the i-type semiconductor layer for which preferably has the silicon-system thin film of the present invention. Another embodiment of the photovoltaic device of the present invention has at least 2 pin junctions, the i-type semiconductor layer for the pin junction closest to the substrate preferably having the silicon-system thin film of the present invention.

DESCRIPTION OF PREFERRED EMBODIMENTS

Figure 1:
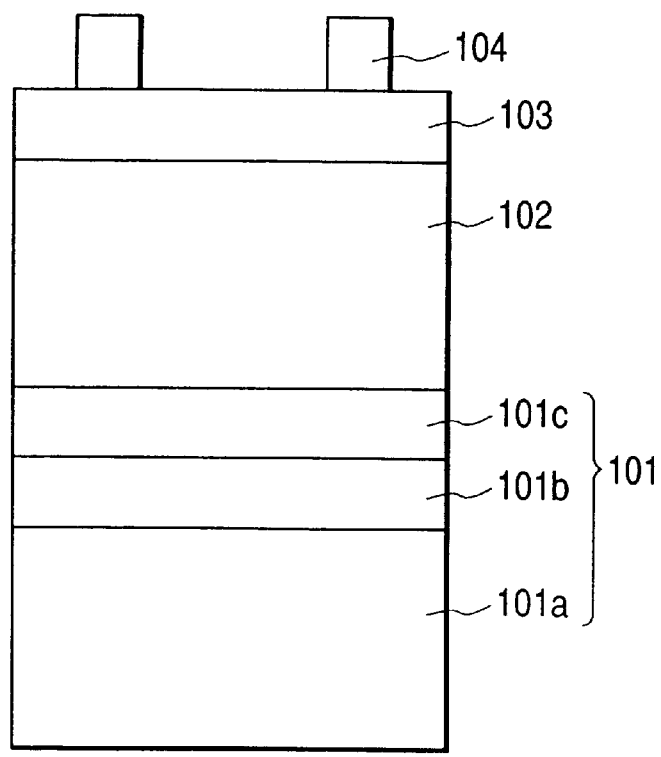
FIG. 1 is a schematically shows a section of one embodiment of the photovoltaic device of the present invention.

The inventor of the present invention have found, after extensive studies to solve the above problems, that a silicon-system thin film has well-passivated grain boundaries, a good crystallinity and high photoelectric conversion efficiency, in spite of being formed at a high film-making rate, when it is formed in such a way to contain at least 1 ppm of phosphorus atoms and to have a diffraction intensity at the (220) plane with X ray pattern or electron beam pattern of at least 30% of total diffraction intensity.

The above constitution brings the following preferable effects:

Silicon showing crystallinity has, in general, a diamond structure in which each silicon atom is the center of a tetrahedron formed by its nearest neighbors. It is however considered that the grain boundaries in a crystalline silicon-system thin film, in particular microcrystalline thin film, are irregular in places to have other coordination numbers, due to strained structures and concentrated dislocations. When a silicon-system thin film is doped with trace quantities of phosphorus atoms, these atoms are conceivably enter the irregular grain boundaries to passivate them, thereby improving carrier mobility, i.e., $\mu\tau$ product. As a result, carrier mobility in the film is prevented from being decreased, allowing the film to be formed at a high rate.

Concentration of the phosphorus atoms in the silicon-system thin film is preferably 100 ppm or less. When exceeding 100 ppm, the phosphorous atoms may work to degrade film quality and decrease carrier mobility, and in particular may decrease photoelectric conversion efficiency of the photovoltaic device that incorporates the silicon-system thin film.

The crystalline, silicon-system thin film formed to have the (220) plane oriented in parallel to the substrate has hexagonal channels running in a direction perpendicular to the substrate, which conceivably increase carrier mobility in that direction. The ASTM card indicates that diffraction intensity at the (220) plane of non-oriented crystalline silicon is approximately 23% of total diffraction intensity, or totaled intensities in a range from a low angle side to the side reflected 11 times. In other words, a crystalline, silicon-system thin film having a diffraction intensity at the (220) plane higher than 23% of total intensity is oriented in the (220) plane direction. It is considered that the thin film will have notably improved carrier mobility, when its diffraction intensity at the (220) plane is 30% or more of total diffraction intensity. It is also considered that orientation in the (220) plane direction allows to form the thin film of improved crystallinity, because of controlled strain of the structure and concentration of dislocations.

The photovoltaic device of the present invention comprises a plurality of silicon-system semiconductor layers, different from each other in electroconductance type, formed one on another on an electroconductive substrate, wherein at least one of these layers contains the silicon-system thin film of the present invention. In particular, a photovoltaic device with n-, i- and p-type silicon-system semiconductor layers placed one on another in this order will show excellent photovoltaic characteristics, when the i-type silicon-system semiconductor layer working as the light-absorbing layer contains the silicon-system thin film of the present invention. The i-type silicon-system semiconductor layer may essentially consist of the silicon-system thin film of the present invention, or comprise the silicon-system thin film of the present invention and morphologically another type of semiconductor layer (e.g., amorphous silicon layer), placed one on another. The above constitutions can be also used for the photovoltaic device with 2 or more sets of n-, i- and p-type silicon-system semiconductor layers placed in this order. The silicon-system thin film of the present invention suffers no or an extremely small degree of photodegradation, with the result that the photovoltaic device will suffer no or an extremely small degree of photodegradation, when it uses the silicon-system thin film as the light-absorbing layer.

It is preferable to form the silicon-system thin film of the present invention and the semiconductor layer for the photovoltaic device of the present invention by CVD using a high-frequency waves of 10 MHz to 10 GHz. CVD can form the silicon-system thin film at lower temperature than the method starting with the liquid phase, and hence reduces cost of the silicon-system thin film and photovoltaic device of the present invention.

The photovoltaic device of the present invention preferably contains phosphorus atoms unevenly distributed in the silicon-system thin film, with concentration increasing towards the electroconductive substrate. It is considered that the irregular grain boundaries are present at a higher density in the film portion produced during the initial stage of film-making process, i.e., in the vicinity of the electroconductive substrate, because of relatively smaller grains for that portion, and the phosphorus atoms can exhibit their favorable effects more efficiently when present at a higher concentration in that portion.

Next, the constituent members for the photovoltaic device of the present invention are described. FIG. 1 schematically shows a section of one embodiment of the photovoltaic device of the present invention, where 101a, 101b, and 101c represent an electroconductive substrate, 102 is a semiconductor layer, 103 is a transparent electrode, and 104 is a current-collecting electrode. The electroconductive substrate 101 is composed of a substrate 101a, metallic layer 101b and transparent, electroconductive layer 101c.

(Substrate)

The substrate 101a is a plate- or sheet-shaped member, suitable materials therefor including metals, resin, glass, ceramics and bulk semiconductors. It may have fine irregularities on the surface. It may be transparent for the design to make the photovoltaic device irradiated with light from the substrate side. It can be a long shape, to allow the film-making process to be effected continuously by the roll-to-roll method. The substrate 101a is preferably made of stainless steel, polyimide or other flexible materials.

(Metallic Layer)

The metallic layer 101b has two major roles, one as the electrode and the other as the reflection layer which reflects light reaching the substrate back to the semiconductor layer for further utilization of light. Suitable materials for the metallic layer include Al, Cu, Ag, Au, and Cu—Mg, and suitable methods for forming the layer include evaporation, sputtering, electrodeposition and printing.

The metallic layer 101b preferably has irregularities on the surface. This extends reflected light path length in the semiconductor layer 102 and increases short-circuit current. The metallic layer may not be necessary, when the substrate 101a is electroconductive.

(Transparent, Electroconductive Layer)

The transparent, electroconductive layer 101c works to increase irregular reflection of incident and reflected light, thereby extending light path length in the semiconductor layer 102. It has another role of promoting diffusion or migration of the elements in the metallic layer 101b towards the semiconductor layer 102, thereby preventing the photovoltaic device from being shunted. It has still another role of preventing short-circuits caused by the defects, e.g., pinholes, in the semiconductor layer 102, when provided with an adequate level of resistance. Conductivity of the transparent, electroconductive layer 101c is preferably $10^{-8}$ (1/$\Omega$cm) or higher but $10^{-1}$ (1/$\Omega$cm) or lower. The transparent, electroconductive layer 101c preferably has irregularities on the surface, as is the case with the metallic layer 101b. It is preferably made of an electroconductive oxide, e.g., ZnO and ITO, and preferably formed by evaporation, sputtering, CVD, electrodeposition or the like. The electroconductive oxide may be doped with an additive to change its conductivity.

(Electroconductive Substrate)

The electroconductive substrates 101a through 101c are prepared by the above procedure, wherein the substrate 101a is laminated, as required, with the metallic layer 101b and transparent, electroconductive layer 101c. It may be further provided with an insulating layer as the intermediate layer, to facilitate integration of the device.

(Semiconductor Layer)

The suitable materials for the silicon-system thin film of the present invention and semiconductor layer 102 include amorphous and crystalline silicon, which may be used alone or in combination. An alloy of Si with C or Ge may be used in place of Si. The semiconductor layer 102 contains hydrogen and/or halogen atoms, preferably at 0.1 to 40 atomic %. It may further contain oxygen, nitrogen or the like. It is doped with an element of the group III to be a p-type semiconductor layer, and with an element of the group V to be an n-type layer. In the case of a stacked cell, i.e., a photovoltaic device with two or more p-i-n junctions, the i-type semiconductor layer for the p-i-n junction preferably has a band gap decreasing as it moves from the incident light side. Moreover, the i-type semiconductor layer has a band gap distribution within the layer in the thickness direction, with the minimum in the half nearer to the p-type layer. The doped layer (p- or n-type layer) nearer to the incident light side is preferably composed of a crystalline semiconductor absorbing less light or semiconductor having a wider band gap.

(Method For Forming the Semiconductor Layer)

High frequency plasma CVD is a suitable method for forming the semiconductor layer 102 and silicon-system thin film of the present invention. The preferable procedure for forming the semiconductor layer 102 by high frequency plasma CVD is described below:

(1) Reduce pressure in the deposition chamber, which is serviceable under a vacuum (vacuum chamber), to a given vacuum level.

(2) Evacuate the deposition chamber by a vacuum pump, while passing the feed and diluent gases into the chamber, to set pressure in the chamber at a given vacuum level.

(3) Set temperature of the substrate by a heater at a given level.

(4) Direct high-frequency waves from an high frequency power source into the deposition chamber. These waves may be directed by a wave guide into the deposition chamber via a dielectric window, e.g., of an alumina ceramic, or directed by a coaxial cable into the chamber via a metallic electrode.

(5) Decompose the feed gas by a plasma evolved in the chamber, to form a deposited film on the electroconductive substrate 101 set up in the chamber. Repeat the above steps 2 or more times, as required, to form the semiconductor layer 102.

The preferable conditions for forming the semiconductor layer 102 are 100 to 450° C. as substrate temperature in the deposition chamber, 0.5 mTorr to 10 Torr as deposition pressure and 0.001 to 1 W/cm$^3$ as high frequency power.

The preferable feed gases for forming the semiconductor layer 102 and silicon-system thin film of the present invention include $SiH_4$, $Si_2H_6$ and $SiF_4$ etc. which have silicon atoms and can be gasified. When an alloy of silicon is used in place of Si, the feed gas preferably contains $GeH_4$ or $CH_4$ which has Ge or C and can be gasified. The feed gas is preferably diluted with a diluent gas, before being passed into the deposition chamber. Preferable diluent gases include $H_2$ and He. A compound which has nitrogen, oxygen or the like and can be gasified may be added as the feed or diluent gas. The preferable dopant gases to form the p-type semiconductor layer include $B_2H_6$ and $BF_3$, and those to form the n-type semiconductor layer include $PH_3$ and $PF_3$. The preferable gases to dope the silicon-system thin film of the present invention with phosphorus atoms include $PH_3$ and $PF_3$.

It is preferable, when a crystalline thin film, or a layer absorbing a limited quantity of light or having a wide band gap (e.g., SiC) is to be deposited, that a feed gas is diluted with a larger quantity of diluent gas and driven into the deposition chamber by a relatively high frequency power.

(Transparent Electrode)

The transparent electrode 103, working as the electrode, can function as a reflection-preventive film, when its thickness is adequately set.

The preferable materials for the transparent electrode 103 include ITO, ZnO and $InO_3$, and the preferable methods for forming the electrode include evaporation, CVD, spraying, spin on and immersion. These materials may be doped with an additive which can change conductivity.

(Current-Collecting Electrode)

The current-collecting electrode 104 is formed on the transparent electrode 103 to improve the current-collecting effect for the device. It is suitably formed by sputtering to form a metal layer of electrode pattern with a mask, printing with electroconductive or solder paste, or fixing a metallic wire by an electroconductive paste.

The photovoltaic device may be coated, as required, with a protective layer on each side or both sides. At the same time, it may be also reinforced with an adequate material, e.g., steel plate, for the back side, e.g., the incident light side or opposite side.

The present invention is described more concretely with a solar cell taken as the Example of the photovoltaic device by following Examples, which by no means limit the present invention.

EXAMPLE 1

Figure 3:
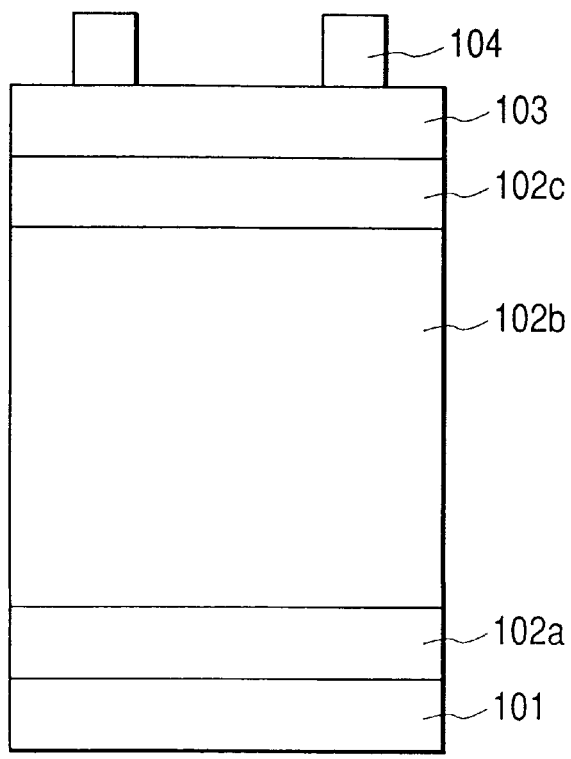
FIG. 3 is a schematically shows a section of one embodiment of the photovoltaic device which contains the silicon-system thin film of the present invention.
Figure 2:
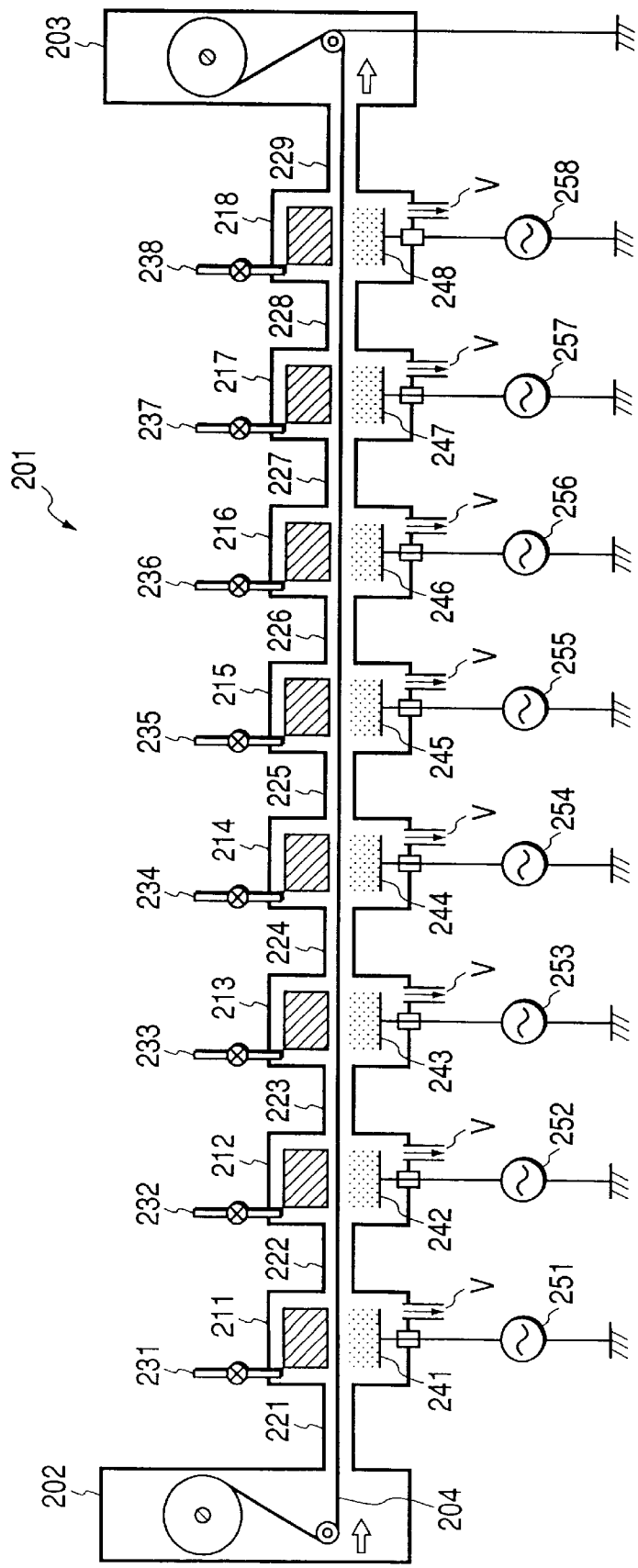
FIG. 2 is a schematically shows a section of one example of apparatus for depositing films, used to produce the silicon-system thin film and photovoltaic device of the present invention.

The apparatus for depositing films 201, shown in FIG. 2, was used to form the p-i-n type photovoltaic device, shown in FIG. 3, by the following procedure:

FIG. 2 schematically shows a section of one example of apparatus 201 for depositing films, used to produce the silicon-system thin film and photovoltaic device of the present invention, where a substrate feeding vessel 202, semiconductor-forming vacuum vessels 211 to 218, and substrate winding vessel 203 are connected to one another by gas gates 221 to 229. A band-shaped electroconductive substrate 204 is set in the apparatus 201, to pass through each vessel and gas gate. The band-shaped electroconductive substrate 204, wound on a bobbin set on the substrate feeding vessel 202, is sent to the substrate winding vessel 203, where it is wound on another bobbin. Each of the semiconductor-forming vacuum vessels 211 to 218 is equipped with a discharge chamber with a discharge electrode (one of 241 to 248), where high frequency power from one of high frequency power sources 251 to 258 is applied to the corresponding discharge electrode 241 to 248 to generate a glow discharge, by which the feed gas is decomposed to form the semiconductor layer on the electroconductive substrate 204. Each of the semiconductor-forming vacuum vessels 211 to 218 is equipped with a corresponding gas inlet nozzles 231 to 238, through which the feed and diluent gases are introduced.

The apparatus 201 for depositing films, shown in FIG. 2, is equipped with 8 semiconductor-forming vacuum vessels, all of which were not necessarily used to generate a glow discharge in Examples described below. In other words, the glow discharge can be generated in one or more semiconductor-forming vacuum vessels, depending on a layered configuration of the photovoltaic device to be produced. Each of the semiconductor-forming vacuum vessels is equipped with a plate for adjusting the film-making region, which is not shown, to adjust contact area between the electroconductive substrate 204 in the vessel and discharge space. This plate is adjusted to adjust thickness of the semiconductor layer formed in the vessel.

FIG. 3 schematically shows a section of one embodiment of the photovoltaic device which contains the silicon-system thin film of the present invention, where the members similar to those shown in FIG. 1 are marked with the same notations and not described below.

The semiconductor layer for this photovoltaic device is composed of an amorphous n-type semiconductor layer 102a, microcrystalline i-type semiconductor layer 102b and microcrystalline p-type semiconductor layer 102c. In other words, this photovoltaic device is the so-called p-i-n type single-cell photovoltaic device, where the microcrystalline i-type semiconductor layer 102b is the silicon-system thin film of the present invention.

The method for producing the photovoltaic device, used in Example 1, is described below by referring to FIGS. 2 and 3.

A band-shaped substrate of stainless steel (SUS430BA), 40 cm wide, 200 m long and 0.125 mm thick, was sufficiently degreased and washed, and set up on a continuous sputtering unit, which is not shown. The substrate was then coated with a 100 nm thick thin film of Al by sputtering/evaporation with an Al target, and then with a 1.2 $\mu$m thick thin film of ZnO on the Al film by sputtering/evaporation, to form the band-shaped, electroconductive substrate 101 (204).

Next, the bobbin wound with the electroconductive substrate 204 was set up on the substrate feeding vessel 202, and the substrate 204 was passed through the inlet side gas gate 221, semiconductor-forming vacuum vessels 211, 212, 213, 214, 215, 216, 217 and 218, outlet side gas gate 229, and substrate winding vessel 203, while it was under a controlled tension to prevent sagging so as not to allow the beltlike electroconductive substrate 204 slacken. The space over the substrate feeding vessel 202, semiconductor-forming vacuum vessels 211, 212, 213, 214, 215, 216, 217 and 218, and substrate winding vessel 203 was sufficiently evacuated from an exhaust port V by a vacuum exhaust system composed of a vacuum pump, which is not shown, to keep a vacuum of $5 \times 10^{-6}$ Torr or lower.

Next, the feed and diluent gases for forming the amorphous n-type semiconductor layer were passed into the semiconductor-forming vacuum vessel 211 via the gas inlet nozzle 231; the feed and diluent gases for forming the microcrystalline i-type semiconductor layer were passed into the semiconductor-forming vacuum vessels 212, 213 and 214 via the gas inlet nozzles 232, 233 and 234; and the feed and diluent gases for forming the microcrystalline p-type semiconductor layer were passed into the semiconductor-forming vacuum vessel 215 via the gas inlet nozzle 235; while the vacuum exhaust system was in service. The conditions under which each layer was formed are given in Table 1. The semiconductor-forming vacuum vessels 216, 217 and 218 were supplied with 200 sccm of $H_2$ gas via the gas inlet nozzles 236, 237 and 238, and, at the same time, each of the gas gates 221, 222, 223, 224, 225, 226, 227, 228 and 229 was supplied with 500 sccm of $H_2$ gas via a corresponding gate gas supply tube, which is not shown. Exhaust capacity of the vacuum exhaust system was adjusted under the above conditions, in such a way to keep pressure in each semiconductor-forming vacuum vessel at a given level.

Movement of the band-shaped, electroconductive substrate 204 was started from the substrate feeding vessel 202 towards the substrate winding vessel 203, when pressure in each of the semiconductor-forming vacuum vessels was stabilized. The electroconductive substrate 204 was heated to 300° C. by an infrared lamp heater, which is not shown, while it was moved.

Each of the discharge electrodes 241, 242, 243, 244 and 245 in the corresponding semiconductor-forming vacuum vessel 211, 212, 213, 214 or 215 was supplied with high frequency power from the corresponding high frequency power source 251, 252, 253, 254 or 255, to generate a glow discharge in each discharge chamber in the corresponding semiconductor-forming vacuum vessel 211, 212, 213, 214 or 215. As a result, the band-shaped, electroconductive substrate 204 was coated with a 20 nm thick amorphous n-type semiconductor layer 102a in the semiconductor-forming vacuum vessel 211, with a 1.5 $\mu$m thick microcrystalline i-type semiconductor layer 102b in the semiconductor-forming vacuum vessels 212, 213 and 214, and with a 10 nm thick microcrystalline p-type semiconductor layer 102c in the semiconductor-forming vacuum vessel 215, in this order, to form the n-i-p type photovoltaic device shown in FIG. 3 (Example 1-1). The semiconductor-forming vacuum vessel 211 was supplied with high frequency power (frequency: 13.56 MHz, power: 5 mW/cm$^3$), the semiconductor-forming vacuum vessels 212, 213 and 214 with high frequency power (frequency: 100 MHz, power: 20 mW/cm$^3$), and the semiconductor-forming vacuum vessel 215 with high frequency power (frequency: 13.56 MHz, power: 30 mW/cm$^3$). Distance between the discharge electrode and electroconductive substrate 204 was set at 5 cm.

The same procedure as used for Example 1–1 was repeated, except that high frequency power for the semiconductor-forming vacuum vessels 212, 213 and 214 was varied, while adjusting the plate for adjusting the film-making region and substrate transferring rate (Examples 1-2 to 1-5). These photovoltaic devices were the same as that formed in Example 1-1, including thickness of the microcrystalline i-type semiconductor layers 102b, except that the i-type layers were deposited at different rates. The high frequency power used in these Examples was 50 mW/cm$^3$ for Example 1-2, 100 mW/cm$^3$ for Example 1-3, 150 mW/cm$^3$ for Example 1-4, and 200 mW/cm$^3$ for Example 1–5.

The band-shaped, photovoltaic devices formed above were separated from each other, and each was formed into a solar cell module, 36 cm×22 cm in size, by a continuous, module-forming unit, which is not shown (Examples 1-1 to 1-5). These modules are the same, except their i-type layers were deposited at different rates.

The same procedures as used for Examples 1-1 to 1-5 were repeated, except that the plates for adjusting the film-making regions in the semiconductor-forming vacuum vessels 211 and 215 were completely closed (Examples 1-6 to 1-10). These device sample corresponded to those formed in Examples 1-1 to 1-5, except that the i-type layer was the sole semiconductor layer on the substrate.

Comparative Example 1

The same procedures as used for Examples 1-1 to 1-10 were repeated, except that $PH_3$ (diluted to 5 ppm with H2) was removed from the feed gas stream, shown in Table 1, for the semiconductor-forming vacuum vessels 212, 213 and 214, to form the solar cell modules (Comparative Examples 1-1 to 1-5) and samples (Comparative Examples 1-6 to 1-10).

The solar cell modules formed in Example 1 and Comparative Example 1 were analyzed for their photoelectric conversion efficiencies using a solar simulator (AM1.5, 100 mW/cm$^2$). The samples were analyzed by an X-ray diffractometer to determine their diffraction intensities, and by SIMS to determine P atom concentration relative to that of Si atoms.

Table 2 shows film-making rate of the i-type semiconductor layer, P atom concentration relative to that of Si atoms in the i-type semiconductor layer, X-ray diffraction intensity at the (220) plane relative to the total diffraction intensity of the i-type semiconductor layer, and photoelectric conversion efficiency of the solar cell module, for the modules formed in Example 1 and Comparative Example 1.

As shown in Table 2, the solar cell modules, formed in Examples 1-1 to 1-5, with the microcrystalline i-type semiconductor layer containing at least 1 ppm of the P atoms show an essentially constant photoelectric conversion efficiency even when film-making rate was increased for the i-type semiconductor layer, whereas those formed in Comparative Examples 1-1 to 1-5 with the microcrystalline i-type semiconductor layer containing the P atoms only at below 1 ppm lose photoelectric conversion efficiency more significantly as the film-making rate was increased. This means that the silicon-system thin film and photovoltaic device of the present invention can be produced at a higher film-making rate for the i-type semiconductor layer essentially without losing photoelectric conversion efficiency.

Example 2

The same procedure as used for Example 1-4 was repeated, except that distance between the discharge electrode and electroconductive substrate 204 was changed in a range from 3 to 10 cm, for the discharge electrodes 242, 243 and 244 in the semiconductor-forming vacuum vessels 212, 213 and 214, to form the photovoltaic devices of the constitution shown in FIG. 3, and thereby to form the solar cell modules (Examples 2-1 to 2-3) and samples (Examples 2-4 to 2-6) with the i-type layer as the sole semiconductor layer on the substrate.

Comparative Example 2

The same procedure as used for Example 2 was repeated, except that distance between the discharge electrode and electroconductive substrate 204 was set at 2 cm, for the discharge electrodes 242, 243 and 244 in the semiconductor-forming vacuum vessels 212, 213 and 214, to form the photovoltaic device of the constitution shown in FIG. 3, and thereby to form the solar cell module (Comparative Example 2-1) and sample (Comparative Example 2-2) with the i-type layer as the sole semiconductor layer on the substrate.

The solar cell modules and samples formed in Example 2 and Comparative Example 2 were analyzed for the items in a manner similar to those for the modules and samples formed in Example 1 and Comparative Example 1. The results are given in Table 3.

As shown in Table 3, the solar cell modules formed in Examples 2-1 to 2-3, whose X-ray diffraction intensity at the (220) plane is at least 30% of total diffraction intensity, has a higher photoelectric conversion efficiency than the module formed in Comparative Examples 2-1, whose X-ray diffraction intensity at the (220) plane is less than 30% of total diffraction intensity. These results also indicate that distance between the discharge electrode and electroconductive substrate is preferably at least 3 cm, in order to secure the above diffraction intensity ratio at 30% or higher. Thus, it is concluded that the silicon-system thin film and photovoltaic device of the present invention have excellent characteristics in that they show a high photoelectric conversion efficiency.

Example 3

Figure 4:
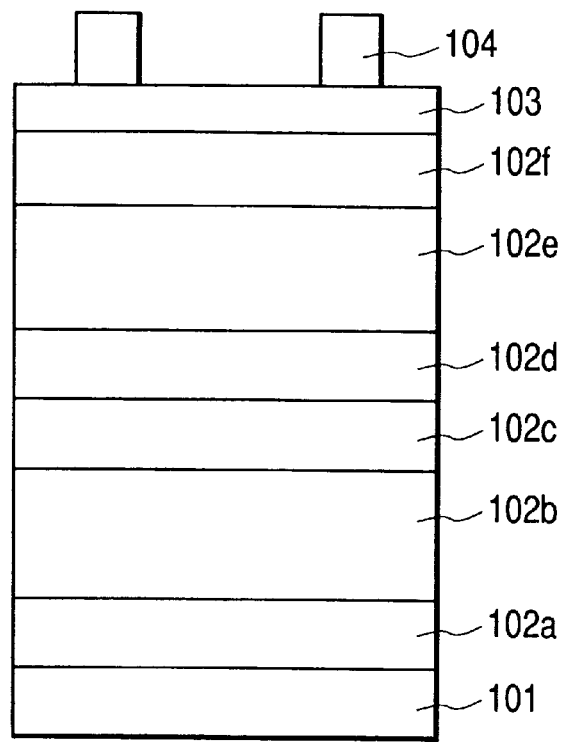
FIG. 4 is a schematically shows a section of another embodiment of the photovoltaic device which contains the silicon-system thin film of the present invention.

The apparatus 201 for depositing films, shown in FIG. 2, was used to form the p-i-n/p-i-n type photovoltaic device of tandem constitution shown in FIG. 4.

FIG. 4 schematically shows a section of one embodiment of the photovoltaic device which contains the silicon-system thin film of the present invention, where the members similar to those shown in FIGS. 1 and 3 are marked with the same notations and not described below.

This photovoltaic device has a semiconductor layer with a p-i-n junction composed of an amorphous n-type semiconductor layer 102d, amorphous i-type semiconductor layer 102e and microcrystalline p-type semiconductor layer 102f on the p-i-n junction shown in FIG. 3.

The bottom cell, i.e., the n-i-p junction nearer to the substrate, for the above tandem type photovoltaic device was formed by the same procedure as that used for Example 1-4. For the top cell, i.e., the p-i-n junction nearer to the incident light side, the amorphous n-type semiconductor layer 102d was formed in the semiconductor-forming vacuum vessel 216, the amorphous i-type semiconductor layer 102e in the semiconductor-forming vacuum vessels 217, and the microcrystalline p-type semiconductor layer 102f in the semiconductor-forming vacuum vessel 218. Thus, the p-i-n junction for the top cell differed from that for the bottom cell in that the i-type semiconductor layer for the former cell was amorphous.

The amorphous n-type semiconductor layer 102d and microcrystalline p-type semiconductor layer 102f for the top cell were formed under the conditions shown in Table 1 for the corresponding conductance types. The amorphous i-type semiconductor layer 102e was formed under the conditions of $SiH_4$ as the feed gas: 50 sccm, $H_2$: 500 sccm, substrate temperature: 220° C., and pressure: 1.2 Torr.

The solar cell module (Example 3) was formed in a manner similar to that for Example 1.

Comparative Example 3

Figure 5:
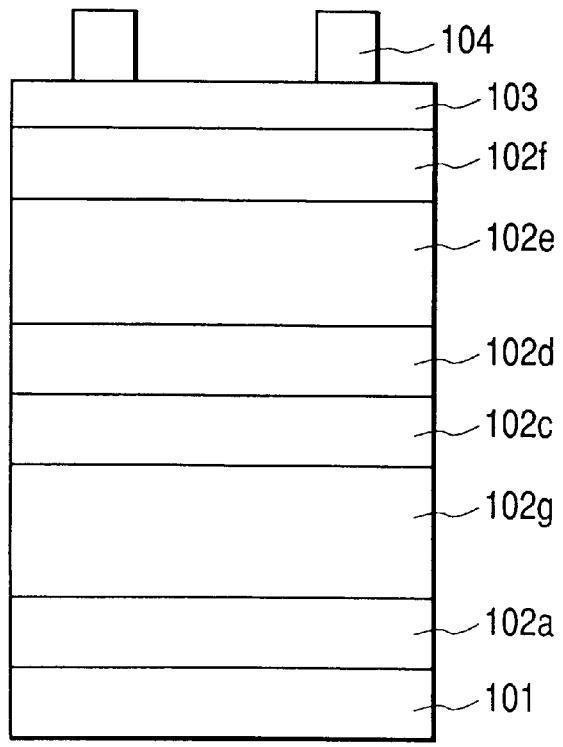
FIG. 5 is a schematically shows a section of one embodiment of the photovoltaic device of Comparative Example.

The tandem type photovoltaic device of the n-i-p/n-i-p constitution shown in FIG. 5 was formed in a manner similar to that for Example 3. The tandem type photovoltaic device shown in FIG. 5 was the same as that shown in FIG. 4, except that the i-type semiconductor layer 102g for the bottom cell was amorphous. The photovoltaic device of Comparative Example 3 was formed under the same conditions as those for Example 3, except for the i-type semiconductor layer 102g, which was formed in a manner similar to that for the amorphous i-type semiconductor layer 102e.

The solar cell module was formed in a manner similar to that for Example 3 (Comparative Example 3-1). The sample with the i-type semiconductor layer 102g in the bottom cell as the sole semiconductor layer was also formed (Comparative Example 3-2).

The sample (Comparative Example 3-2) was analyzed by an X-ray diffractometer, to measure its diffraction intensity. However, the analysis detected no diffraction peak.

The solar cell module was analyzed for its photoelectric conversion efficiency using a solar simulator (AM1.5, 100 mW/cm$^2$). Next, this solar cell module was irradiated with simulated sunbeams (AM1.5, 100 mW/cm$^2$) for 500 h while it was kept at 50° C., to determine photodegradation rate of its photoelectric conversion efficiency. The results are given in Table 4.

As shown in Table 4, the solar cell module, formed in Example 3 to contain the silicon-system thin film of the present invention, has photoelectric conversion much more resistant to photodegradation than the solar cell module formed in Comparative Example 3-1. Thus, it is concluded that the photovoltaic device of the present invention has excellent characteristics in that it shows high resistance to photodegradation.

Example 4

The same procedure as that used for Example 1-4 was repeated, except that rate of PH$_3$ (diluted to 5 ppm with H$_2$) to be supplied to the semiconductor-forming vacuum vessel 212 was doubled, to form the solar cell module (Example 4).

The above solar cell module was analyzed for its photoelectric conversion efficiency using a solar simulator (AM1.5, 100 mW/cm$^2$). The solar module formed in Example 4 showed 10% higher photoelectric conversion efficiency than that formed in Example 1-4, indicating that the effects of the present invention are further enhanced by increasing P atom concentration on the electroconductive substrate.

TABLE 1

| n-type semiconductor layer | Feed gases | SiH$_4$: 20 sccm<br>H$_2$: 100 sccm<br>PH$_3$ (Diluted to 2% with H$_2$): 30 sccm |
|---|---|---|
| | Substrate temperature | 300° C. |
| | Pressure | 1.0 Torr |
| i-type semiconductor layer | Feed gases | SiH$_4$: 30 sccm<br>H$_2$: 1.0 slm<br>PH$_3$ (Diluted to 5 ppm with H$_2$): 2.0 sccm |
| | Substrate temperature | 300° C. |
| | Pressure | 300 mTorr |
| p-type semiconductor layer | Feed gases | SiH$_4$: 10 sccm<br>H$_2$: 800 sccm<br>BF$_3$ (Diluted to 2% with H$_2$): 100 sccm |
| | Substrate temperature | 200° C. |
| | Pressure | 1.2 Torr |

TABLE 2

| | Film-making rate (nm/s) | P atom concentration (ppm) | Diffraction intensity at the (220) plane relative to total intensity (%) | Photoelectric conversion efficiency* |
|---|---|---|---|---|
| Examples 1-1, 1-6 | 0.01 | 3 ppm | 60 | 1 |
| Examples 1-2, 1-7 | 0.1 | 3 ppm | 60 | 0.98 |
| Examples 1-3, 1-8 | 0.5 | 3 ppm | 58 | 0.98 |
| Examples 1-4, 1-9 | 1.0 | 3 ppm | 55 | 0.97 |
| Examples 1-5, 1-10 | 2.0 | 3 ppm | 55 | 0.95 |
| Comparative Examples 1-1, 1-6 | 0.01 | <1 ppm | 60 | 1 |
| Comparative Examples 1-2, 1-7 | 0.1 | <1 ppm | 60 | 0.95 |
| Comparative Examples 1-3, 1-8 | 0.5 | <1 ppm | 55 | 0.87 |
| Comparative Examples 1-4, 1-9 | 1.0 | <1 ppm | 50 | 0.82 |
| Comparative Examples 1-5, 1-10 | 2.0 | <1 ppm | 50 | 0.70 |

*Photoelectric conversion efficiency is relative to that formed in Example 1-1 for those formed in Examples, and that formed in Comparative Example 1-1 for those formed in Comparative Examples.

TABLE 3

| | Distance between the substrate and electrode (cm) | Diffraction intensity at the (220) plane relative to total intensity (%) | P atom concentration (ppm) | Photoelectric conversion efficiency* |
|---|---|---|---|---|
| Examples 2-1, 2-4 | 3 | 45 | 3 | 1 |
| Examples 2-2, 2-5 | 5 | 55 | 3 | 1.02 |
| Examples 2-3, 2-6 | 10 | 55 | 3 | 1.01 |
| Comparative Examples 2-1, 2-2 | 2 | 25 | 3 | 0.85 |

TABLE 4

Rate of photodegradation of the photovoltaic device irradiated with simulated sunbeams for 500 h*

| Example 3 | 1 |
|---|---|
| Comparative Example 3-2 | 2.5 |

*Rate of hotodegradation is relative to that formed in Example 3.

This invention provides a silicon-system thin film, characterized by containing at least 1 ppm of phosphorus atoms and diffraction intensity at the (220) plane with X ray or electron beams of at least 30% of total diffraction intensity, in order to passivate the grain boundaries in the thin film.

This invention also provides a photovoltaic device having a plurality of silicon-system semiconductor layers, different from each other in polarity, deposited orderly on a substrate, wherein at least one of the silicon-system semiconductor layers (in particular, i-type semiconductor layer) contains the silicon-system thin film, to enhance photoelectric conversion efficiency.

What is claimed is:
1. A silicon-system thin film, characterized by containing at least 1 ppm of phosphorus atoms and having a diffraction intensity at (220) plane with X ray or electron beams of at least 30% of total diffraction intensity.

2. A silicon-system thin film of claim 1, wherein said silicon-system thin film contains 100 ppm or less of phosphorus atom.

3. A silicon-system thin film of claim 1, which is substantially an i-type semiconductor.

4. A silicon-system thin film of claim 1, wherein a concentration of phosphorus atom in said silicon-system thin film is uneven.

5. A silicon-system thin film of claim 1, which is formed by plasma CVD using a high-frequency wave of 10 MHz or more but 10 GHz or less.

6. A silicon-system thin film of claim 5, which is formed by plasma CVD using a high-frequency wave of 30 MHz or more but 500 MHz or less .

7. A silicon-system thin film of claim 1, wherein Ge or C is contained.

8. A photovoltaic device having a plurality of silicon-system semiconductor layers, different from each other in conductance type, on a substrate, wherein at least one of said silicon-system semiconductor layers has a silicon-system thin film containing at least 1 ppm of phosphorus atoms and having diffraction intensity at (220) plane with X ray or electron beams of at least 30% of total diffraction intensity.

9. A photovoltaic device of claim 8, wherein said silicon-system thin film contains 100 ppm or less of phosphorus atom.

10. A photovoltaic device of claim 8, wherein said silicon-system thin film is substantially an i-type semiconductor.

11. A photovoltaic device of claim 8, which has at least one p-i-n junction, wherein an i-type semiconductor layer for said p-i-n junction has said silicon-system thin film.

12. A photovoltaic device of claim 8, wherein phosphorus atoms are distributed in said silicon-system thin film such that concentration of phosphorus atom is higher towards the substrate.

13. A photovoltaic device of claim 8, wherein said substrate is electroconductive.

14. A photovoltaic device of claim 8, wherein said silicon-system thin film is formed by plasma CVD using a high-frequency wave of 10 MHz or more but 10 GHz or less.

15. A photovoltaic device of claim 14, wherein said silicon-system thin film is formed by plasma CVD using a high-frequency wave of 30 MHz or more but 500 MHz or less.

16. A photovoltaic device of claim 8, wherein said silicon-system thin film contains Ge or C.

17. A photovoltaic device of claim 8, which has at least two p-i-n junctions, wherein an i-type semiconductor layer for said p-i-n junction nearer to the substrate has said silicon-system thin film.

18. A method for forming a silicon-system thin film on a substrate by plasma CVD, wherein said silicon-system thin film is controlled to contain at least 1 ppm of phosphorus atoms and to have diffraction intensity at (220) plane with X ray or electron beams of at least 30% of total diffraction intensity.

19. A method for forming a silicon-system thin film of claim 18, wherein said silicon-system thin film is controlled to contain 100 ppm or less of phosphorus atom.

20. A method for forming a silicon-system thin film of claim 18, wherein said silicon-system thin film is control-led to be an i-type semiconductor.

21. A method for forming a silicon-system thin film of claim 18, wherein said silicon-system thin film is controlled to have phosphorus atoms distributed in said silicon-system thin film such that a concentration of phosphorus atoms is higher towards said substrate.

22. A method for forming a silicon-system thin film of claim 18, wherein a high-frequency wave of 10 MHz or more but 10 GHz or less is used.

23. A method for forming a silicon-system thin film of claim 22, wherein a high-frequency wave of 30 MHz or more but 500 MHz or less is used.

24. A method for forming a silicon-system thin film of claim 22, wherein said high-frequency wave is applied to an electrode at least 3 cm apart from said substrate.

25. A method for fabricating a photovoltaic device which comprises forming a plurality of silicon-system semiconductor layers, different from each other in conductance type, on a substrate by plasma CVD, wherein at least one of said silicon-system semiconductor layers is controlled to have a silicon-system thin film containing at least 1 ppm of phosphorus atoms and having diffraction intensity at (220) plane with X ray or electron beams of at least 30% of total diffraction intensity.

26. A method for fabricating a photovoltaic device of claim 25, wherein said silicon-system semiconductor layer is-controlled to have said silicon-system thin film contain 100 ppm or less of phosphorus atom.

27. A method for fabricating a photovoltaic device of claim 25, wherein said silicon-system semiconductor layer is controlled to have said silicon-system thin film which is an i-type semiconductor.

28. A method for fabricating a photovoltaic device of claim 26, wherein said silicon-system semiconductor layer is controlled to have said silicon-system thin film which is an i-type semiconductor.

29. A method for fabricating a photovoltaic device of claim 25, wherein said silicon-system semiconductor layer is controlled to have phosphorus atoms distributed in said silicon-system thin film such that a concentration of phosphorus atom is higher towards said substrate.

30. A method for fabricating a photovoltaic device of claim 25, wherein said silicon-system thin film is formed using a high-frequency wave of 10 MHz or more but 10 GHz or less.

31. A method for fabricating a photovoltaic device of claim 30, wherein said silicon-system thin film is formed using a high-frequency wave of 30 MHz or more but 500 MHz or less.

32. A method for fabricating a photovoltaic device of claim 30, wherein said high-frequency wave is applied to an electrode at least 3 cm apart from said substrate.

* * * * *

UNITED STATES PATENT AND TRADEMARK OFFICE
CERTIFICATE OF CORRECTION

PATENT NO. : 6,103,138
DATED : August 15, 2000
INVENTOR(S) : Takaharu Kondo

It is certified that error appears in the above-identified patent and that said Letters Patent is hereby corrected as shown below:

Column 2:
Line 43, "is a" should be deleted;
Line 45, "is a" should be deleted;
Line 49, "is a" should be deleted;
Line 52, "is a" should be deleted;
Line 55, "is a" should be deleted;
Line 61, "have" should read --has--.

Column 3:
Line 13, "conceivably" should read --believed to --.

Column 5:
Line 49, "an" should read --a--.

Column 6:
Line 22, "following" should read --the following--; and
Line 26, "spin on" should read --spin coating--.

Column 7:
Line 2, "a" should be deleted; and
Line 50, "slacken." should read --to slacken.--.

Column 9:
Line 1, "211 and 215" should read --211 to 215--; and
Line 8, "H2)" should read --$H_2$)--.

Column 10:
Line 8, "Examples 2-1," should read --Example 2-1,--.

Column 12:
Line 37, "Examples 2-1,
    2-2_____" should read

--Examples 2-1,
    2-2_____
    *Photoelectric conversion efficiency is relative to that formed in
    Example 2-1.--; and

UNITED STATES PATENT AND TRADEMARK OFFICE
CERTIFICATE OF CORRECTION

PATENT NO. : 6,103,138
DATED : August 15, 2000
INVENTOR(S) : Takaharu Kondo

It is certified that error appears in the above-identified patent and that said Letters Patent is hereby corrected as shown below:

Column 12:
Line 49, "hotodegradation" should read --photodegradation--.

Column 14:
Line "control-led" should read --controlled--; and
Line "is-controlled" should read --is controlled--.

Signed and Sealed this

Seventh Day of August, 2001

*Attest:*

NICHOLAS P. GODICI
*Attesting Officer*     *Acting Director of the United States Patent and Trademark Office*